(12) United States Patent
Price, Jr.

(10) Patent No.: US 6,184,727 B1
(45) Date of Patent: Feb. 6, 2001

(54) WRITE DRIVER CIRCUIT HAVING ENHANCED SWITCHING CONTROL CIRCUITRY

(75) Inventor: John J. Price, Jr., Edina, MN (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/292,294

(22) Filed: Apr. 15, 1999

Related U.S. Application Data

(60) Provisional application No. 60/103,502, filed on Oct. 8, 1998.

(51) Int. Cl.[7] ............................... H03B 1/00; H03K 3/00
(52) U.S. Cl. ......................... 327/108; 327/376; 327/377
(58) Field of Search ................................. 327/108, 110, 327/427, 432, 434, 437, 478, 486, 377, 376; 326/82, 83, 86, 89, 90

(56) References Cited

U.S. PATENT DOCUMENTS

| | | | |
|---|---|---|---|
| 3,731,004 | * 5/1973 | Cowpland et al. | 327/110 |
| 5,638,012 | * 6/1997 | Hashimoto et al. | 327/110 |
| 5,751,171 | * 5/1998 | Ngo | 327/110 |
| 5,757,215 | * 5/1998 | Schuelke et al. | 327/110 |
| 5,781,046 | * 7/1998 | Ngo et al. | 327/110 |
| 5,869,988 | 2/1999 | Jusuf et al. | 327/110 |
| 5,990,710 | * 11/1999 | Ngo et al. | 327/110 |

\* cited by examiner

*Primary Examiner*—My-Trang Nu Ton
(74) *Attorney, Agent, or Firm*—Kinney & Lange, P.A.

(57) ABSTRACT

Turn-on and turn-off control circuitry are provided for a write driver circuit having first and second switching devices for directing current in opposite directions through a write head between first and second terminals in response to first and second input signals. The turn-off control circuitry includes first and second active devices coupled to the control elements of the respective first and second switching devices. The first and second active devices are operated to pull current from the control elements of the first and second switching devices in first and second current paths upon activation of appropriate input signals. First and second resistors are connected in the respective first and second current paths. The turn-on control circuitry includes a first resistor coupled between a control element of the first switching device and a fixed voltage and a second resistor coupled between a control clement of the second switching device and the fixed voltage. Active devices are coupled between the control elements of the first and second switching devices and the fixed voltage, the active devices each having a control element coupled to the control clement of the opposite switching device.

14 Claims, 5 Drawing Sheets

WRITE DRIVER CIRCUIT HAVING ENHANCED SWITCHING CONTROL CIRCUITRY

CROSS-REFERENCE TO RELATED APPLICATION(S)

This application claims priority of Provisional Application No. 60/103,502 filed Oct. 8, 1998 for "Magnetic Write Head Driver With Boosted Upper H-Switch Pull-Down Current and Optimized Drive Voltage for a PMOS Pre-Driver" by John J. Price, Jr.

This application is related to U.S. Application No. 09/252, 502, for "Write Driver Circuit Having Programmable Overshoot and Undershoot" and U.S. Application No. 09/282, 557 for filed on even date herewith by John J. Price, Jr. and Donald J. Schulte.

BACKGROUND OF THE INVENTION

This invention relates to write current drivers, and particularly to improvements in H-switch circuits used to supply write current to magnetic recording heads.

H-switch drivers are used in magnetic disk drives to supply write current to the magnetic recording head to write data to recording disks. The H-switch is characterized by four transistor switches or the like, each forming a leg of the H, with the write head coil being connected to terminals across the center span of the H. Current is directed in a first direction through the head's coil by operating two semiconductor switches in opposite legs of the H-switch, whereas current is directed in the opposite direction through the head's coil by operating the other two semiconductor switches. There are two primary goals in the design of an H-switch circuit—a fast transition between current directions and fast settling of the write current to its quiescent value after switching. These parameters are affected by two phenomena known as overshoot and undershoot. Overshoot is the amount by which the write current exceeds its quiescent value immediately following a transition. Undershoot is caused by ringing in the write current waveform following a transition, and measures the amount by which the write current falls short of its quiescent value following a transition, as the write current is ringing and settling to its quiescent value.

Write driver circuits have been introduced that attempt to reduce overshoot and/or undershoot by damping the ringing of the write current waveform following a transition in write current direction. For example, one known solution to the ringing problem has been to connect a damping resistor across the terminals of the write head. The resistive damping reduces the settling time for the write current signal flowing through the head. However, resistive damping has several negative effects on the performance of the write circuit, such as increased rise time in the write current transition. Other circuits have also been designed to reduce overshoot and/or undershoot as much as possible. However, there may be some advantages to a certain amount of overshoot designed into the write driver circuit, since higher levels of overshoot typically reduce the rise time of the write current in a transition. At any rate, enhancing the switching characteristics of the H-switch transistors results in improved performance of the write driver circuit, and there is a continuing need in the art for a write driver circuit that achieves this result to improve the overall performance of the circuit.

BRIEF SUMMARY OF THE INVENTION

The present invention is directed to turn-on and turn-off control circuitry for use in a write driver circuit having first and second switching devices for directing write current in opposite directions through a write head between first and second terminals in response to first and second input signals. The turn-off control circuitry includes a first active device coupled to a control element of the first switching device and a second active device coupled to a control element of the second switching device. First control means operates the first active device to pull current from the control element of the first switching device in a first current path upon activation of the second input signal. Second control means operates the second active device to pull current from the control element of the second switching device in a second current path upon activation of the first input signal. A first resistor is connected in the first current path, and a second resistor is connected in the second current path.

The turn-on control circuitry includes a first resistor coupled between a control element of the first switching device and a fixed voltage and a second resistor coupled between a control element of the second switching device and the fixed voltage. At least one first active device is coupled between the control element of the first switching device and the fixed voltage, the at least one first active device having a control clement coupled to the control clement of the second switching device. At least one second active device is coupled between the control element of the second switching device and the fixed voltage, the at least one second active device having a control element coupled to the control element of the first switching device.

DETAILED DESCRIPTION

Figure 1:
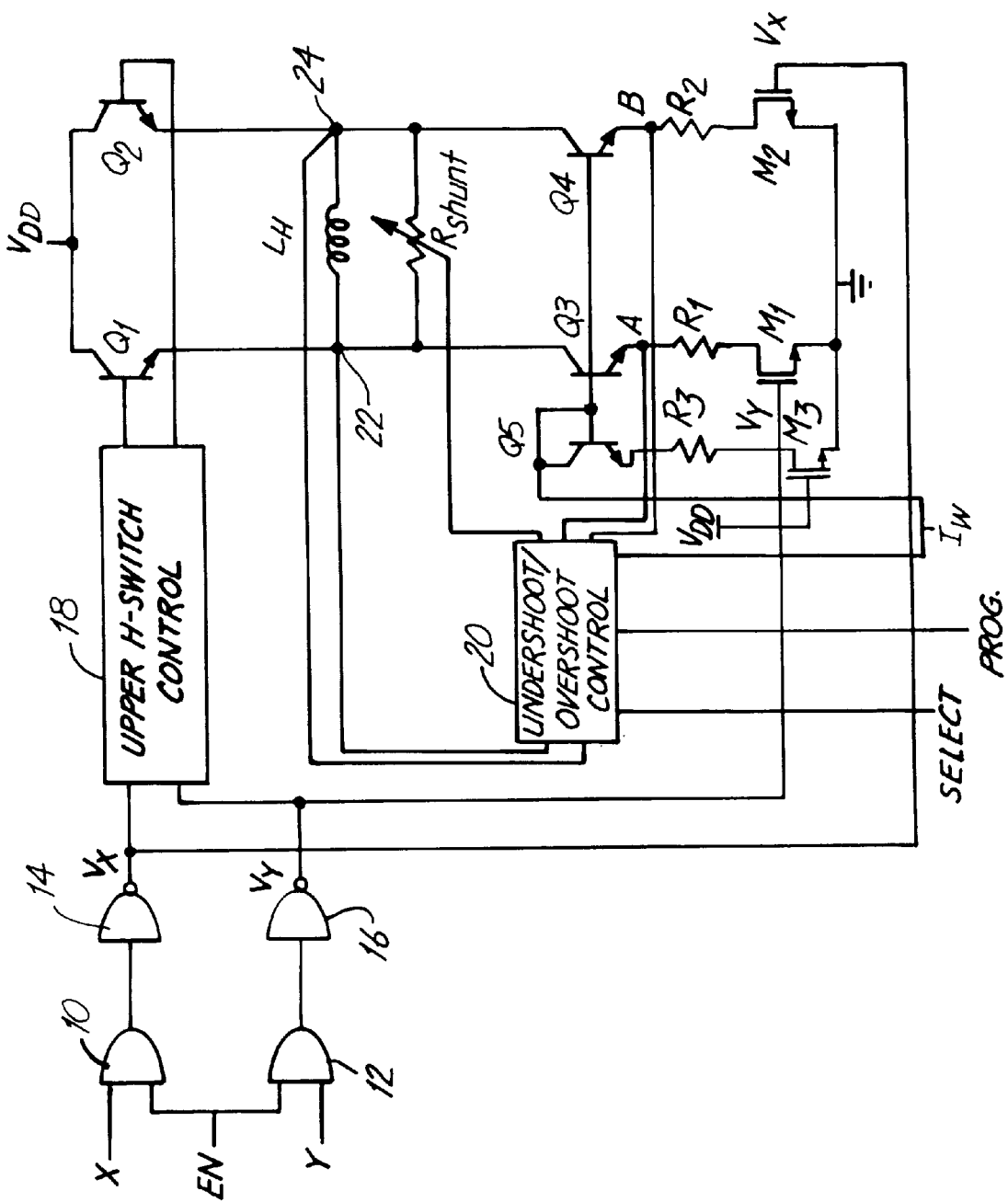
FIG. 1 is a block/circuit diagram of an H-switch write current driver circuit employing an overshoot/undershoot control circuit according to the present invention.

FIG. 1 is a block/circuit diagram of an H-switch write current driver circuit. The driver circuit, in its most basic form, comprises NPN transistors $Q_1$–$Q_4$. Transistors $Q_1$ and $Q_2$ have their collectors connected to voltage source $V_{DD}$ and their emitters connected to respective terminals 22 and 24. Transistors $Q_3$ and $Q_4$ have their collectors connected to terminals 22 and 24. Transistors $Q_3$ and $Q_4$ also form current mirrors with NPN transistor $Q_5$ which is connected to a write current source $I_W$ to mirror the write current into transistors $Q_3$ and $Q_4$. The emitter of transistor $Q_5$ is connected to ground through resistor $R_3$ and MOSFET $M_3$, with the gate of MOSFET $M_3$ being connected to voltage source $V_{DD}$. The current mirrors are completed through the emitters of $Q_3$ and $Q_4$, optional degeneration resistors $R_1$ and $R_2$ and respective MOSFETs $M_1$ and $M_2$ connected to ground. Inductive load $L_H$ is connected between terminals 22 and 24. Data signals representing data to be recorded are provided at terminals X and Y to the inputs of respective AND gates 10 and 12, the second input of each AND gate 10 and 12 being connected to receive a write enable signal. The data signals are inverted by inverters 14 and 16 to derive transistor driving signals $V_X$ and $V_Y$ which are supplied through upper H-switch control circuit 18 to selectively operate one or the other of transistors $Q_1$ and $Q_2$, and to the control terminals of MOSFETs $M_1$ and $M_2$ to selectively operate one or the other of current mirrors $Q_3$ and $Q_4$. Upper H-switch control 18 is described in greater detail in FIG. 2. Undershoot/overshoot control 20 is connected to inductive load $L_H$, to the emitters of transistors $Q_3$ and $Q_4$, and to the control terminal of resistor $R_{shunt}$ to selectively operate and program the overshoot and undershoot of the H-switch circuit. Overshoot/undershoot control 20 is described in more detail below with respect to FIGS. 3A, 3B and 3C.

The H-switch is a symmetrical circuit, with the two write current paths being electrically balanced. Thus, the current path through transistor $Q_1$, terminal 22, load $L_H$, terminal 24, transistor $Q_4$, resistor $R_2$ and MOSFET $M_2$ exhibits the same resistance, capacitance (including parasitic capacitance), inductance and switching characteristics, as the current path through transistor $Q_2$, terminal 24, load $L_H$, terminal 22, transistor $Q_3$, resistor $R_1$ and MOSFET $M_1$. Where a current mirror is employed to supply write current to the load, as in the case of the circuit illustrated in FIG. 1, the mirror usually employs a scaling ratio to scale up the write current $I_W$ supplied to the current mirror driver $Q_5$ to some multiple of $I_W$ to supply to the load.

The H-switch write current driver illustrated in FIG. 1 is operated by applying complementary data signals X and Y to AND gates 10 and 12 to selectively operate transistors $Q_1$ and $Q_2$ and MOSFETs $M_1$ and $M_2$. Thus, when $V_X$ is high and $V_Y$ is low, upper H-switch control 18 operates transistor $Q_1$ to conduction and operates transistor $Q_2$ to non-conduction. Additionally, MOSFET $M_2$ is operated to conduction so that current mirror transistor $Q_4$ provides scaled-up write current $I_W$ to flow through load $L_H$ in the direction from terminal 22 to terminal 24, while MOSFET $M_1$ is operated to non-conduction so that current mirror transistor $Q_3$ is inhibited from providing current to the load. Conversely, when $V_Y$ is high and $V_X$ is low, upper H-switch control 18 operates transistor $Q_2$ to conduction and transistor $Q_1$ to non-conduction, MOSFET $M_1$ is operated to conduction permitting current mirror transistor $Q_3$ to provide current through inductive load L in the direction from terminal 24 to terminal 22, and MOSFET $M_2$ is operated to non-conduction to inhibit current mirror transistor $Q_4$ from supplying current to the load. Parasitic capacitances associated with transistors $Q_1$–$Q_4$ react with the inductive load to cause overshoot and/or undershoot in the write current upon transition. Overshoot/undershoot control 20 serves to selectively program overshoot/undershoot of the write current, and includes selectively operating shunt resistor $R_{shunt}$ in parallel with the inductive load.

Figure 2:
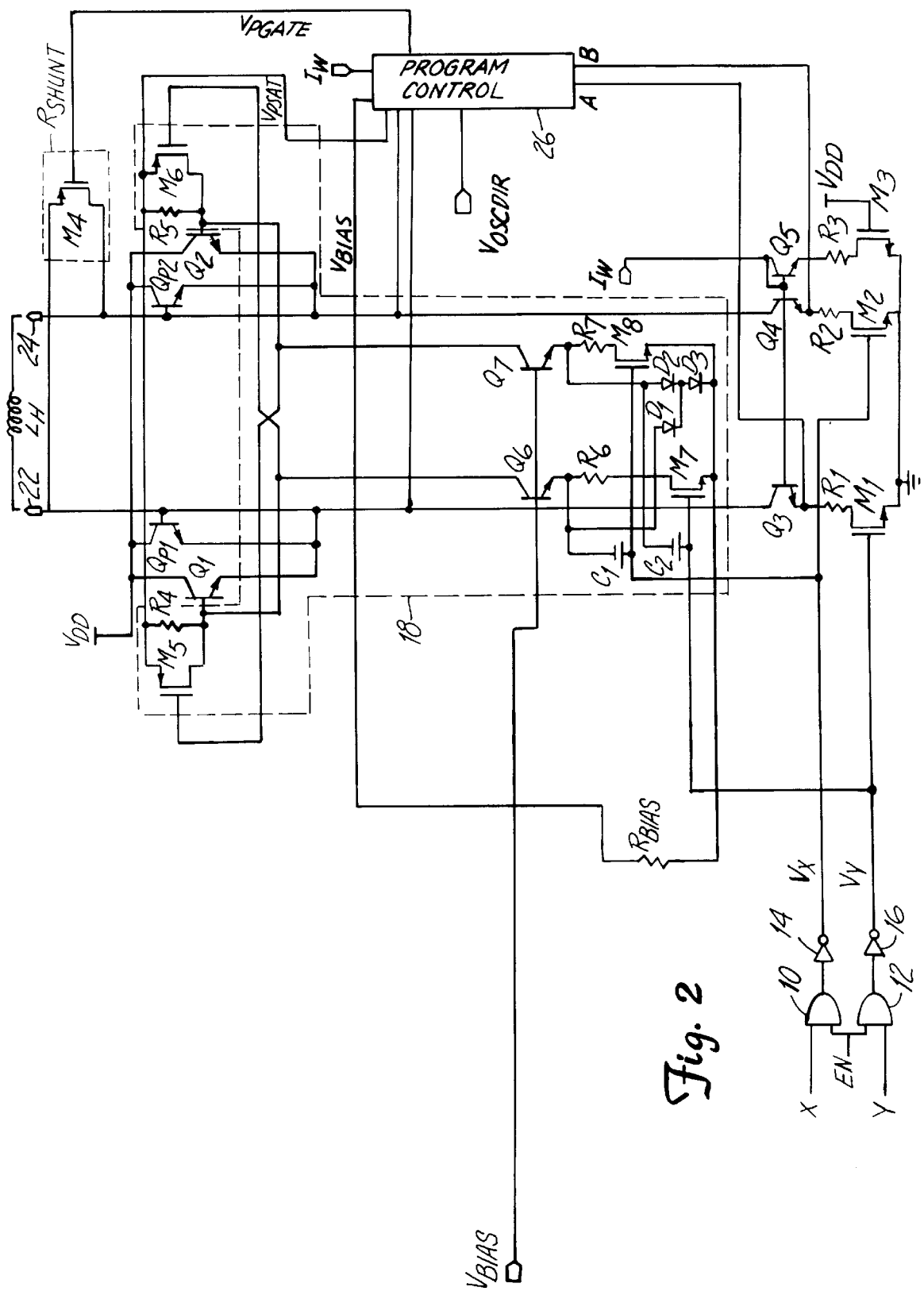
FIG. 2 is a circuit diagram of an H-switch write current driver circuit showing the connection of overshoot/undershoot control circuitry and upper H-switch control circuitry according to an embodiment of the present invention.

FIG. 2 is a circuit diagram of an H-switch write current driver circuit showing the connection of overshoot/undershoot control circuitry and upper H-switch control circuitry 18 according to an embodiment of the present invention. Data signals representing data to be recorded are provided at terminals X and Y to the inputs of respective AND gates 10 and 12, the second input of each AND gate 10 and 12 being connected to receive a write enable signal. The data signals are inverted by inverters 14 and 16 to derive transistor driving signals $V_X$ and $V_Y$ which are supplied to control the write driver circuit. Specifically, $V_X$ is supplied to the gate of MOSFET $M_2$ to selectively operate transistor $Q_4$, which forms a current mirror along with transistor $Q_5$. Similarly, $V_Y$ is supplied to the gate of MOSFET $M_1$ to selectively operate transistor $Q_3$, which also forms a current mirror along with transistor $Q_5$. Transistor $Q_5$ is constantly operated to conduction by connecting the gate of MOSFET $M_3$ to voltage source $V_{DD}$.

Transistor driver signals $V_X$ and $V_Y$ also drive upper H-switch control circuitry 18. Upper H-switch control circuitry 18 includes MOSFETs $M_7$ and $M_8$, optional degeneration resistors $R_6$ and $R_7$, transistors $Q_6$ and $Q_7$, capacitors $C_1$ and $C_2$ and diodes $D_1$, $D_2$ and $D_3$. Upper H-switch control circuitry 18 is configured as a dual-output current mirror with capacitors $C_1$ and $C_2$ provided to boost the output current when the current mirror initially turns on. For example, when the input $V_Y$ is switched to a high level to turn MOSFET $M_7$ on, the opposite input $V_X$ switches low, which drives a current pulse through capacitor $C_1$ and thereby increases the current in the emitter of transistor $Q_6$. This increase in current pulled through transistor $Q_6$ serves to pull down the voltage at the base of the upper H-switch transistor $Q_1$ more quickly, to improve the turn-off time of transistor $Q_1$ and thereby improve the performance of H-switch. Similarly, when the input $V_X$ switches to a high level to turn MOSFET $M_8$ on, the opposite input $V_Y$ switches low, which drives a current pulse through capacitor $C_2$ and thereby increases the current in the emitter of transistor $Q_7$. This increase in current pulled through transistor $Q_7$ serves to pull down the voltage at the base of upper H-switch transistor $Q_2$ more quickly, to improve the turn-off time of transistor $Q_2$. Diodes $D_1$, $D_2$ and $D_3$ provide clamping for capacitors $C_1$ and $C_2$ in the positive direction so that the capacitors are able to accommodate the next negative transition from a high voltage level to a low voltage level at inputs $V_X$ and $V_Y$.

While one of the upper H-switch transistors must be pulled down quickly upon switching, the opposite H-switch transistor must turn on quickly to switch the direction of current flowing through the write head. In order to achieve this goal, the voltage at the base of upper H-switch transistor $Q_1$ or $Q_2$ must be pulled up quickly during a transition. This is accomplished by providing pull-up resistors $R_4$ and $R_5$ connected between the respective bases of upper H-switch transistors $Q_1$ and $Q_2$ and a high voltage $V_{PSAT}$. An additional current path between the base of transistor $Q_1$ and $V_{PSAT}$ is provided by PMOSFET $M_5$, and an additional current path between the base of transistor $Q_2$ and $V_{PSAT}$ is provided by PMOSFET $M_6$. The gate of PMOSFET $M_5$ is connected directly to the opposite side of the upper H-switch driver (to the base of transistor $Q_2$), and the gate of PMOSFET $M_6$ is likewise connected directly to the base of transistor $Q_1$. Thus, when it is desirable to drive one of the PMOSFETs to maximum conduction, the opposite upper H-switch transistor base voltage will have already been pulled down toward ground, resulting in a maximum voltage difference between the gate and the source of the active PMOSFET and therefore maximum pull-up of the voltage at the base of the upper H-switch transistor to turn it on. After the transition has been completed, the voltage at the base of the opposite H-switch transistor is pulled back up by one of transistors $Q_{P1}$ and $Q_{P2}$, which decreases the driving of the active PMOSFET and thereby preserves the reliability of the PMOSFET devices by only driving them to maximum conduction immediately following a transition.

Program control block 26 is connected at various points throughout the schematic. The circuitry contained in program control block 26 is described in greater detail in FIGS. 3A, 3B and 3C, which are edge-matched as shown in FIG. 4. Program control block 26 provides a $V_{PGATE}$ signal that is connected to the base of PMOSFET $M_4$. PMOSFET $M_4$ is connected between head terminals 22 and 24 in parallel with the write head $L_H$. The $V_{PGATE}$ signal is related to the voltage across the head, so that when the voltage difference between terminals 22 and 24 is large, PMOSFET $M_4$ is activated to serve as a shunt resistor to divert current from flowing through the head. By activating PMOSFET $M_4$ at the proper time, the diversion of current may be used to reduce overshoot in the write current waveform, and utilizing a PMOSFET device provides a real termination impedance which helps to reduce overshoot and therefore reduces undershoot and ringing in the system as well.

Figure 3A:
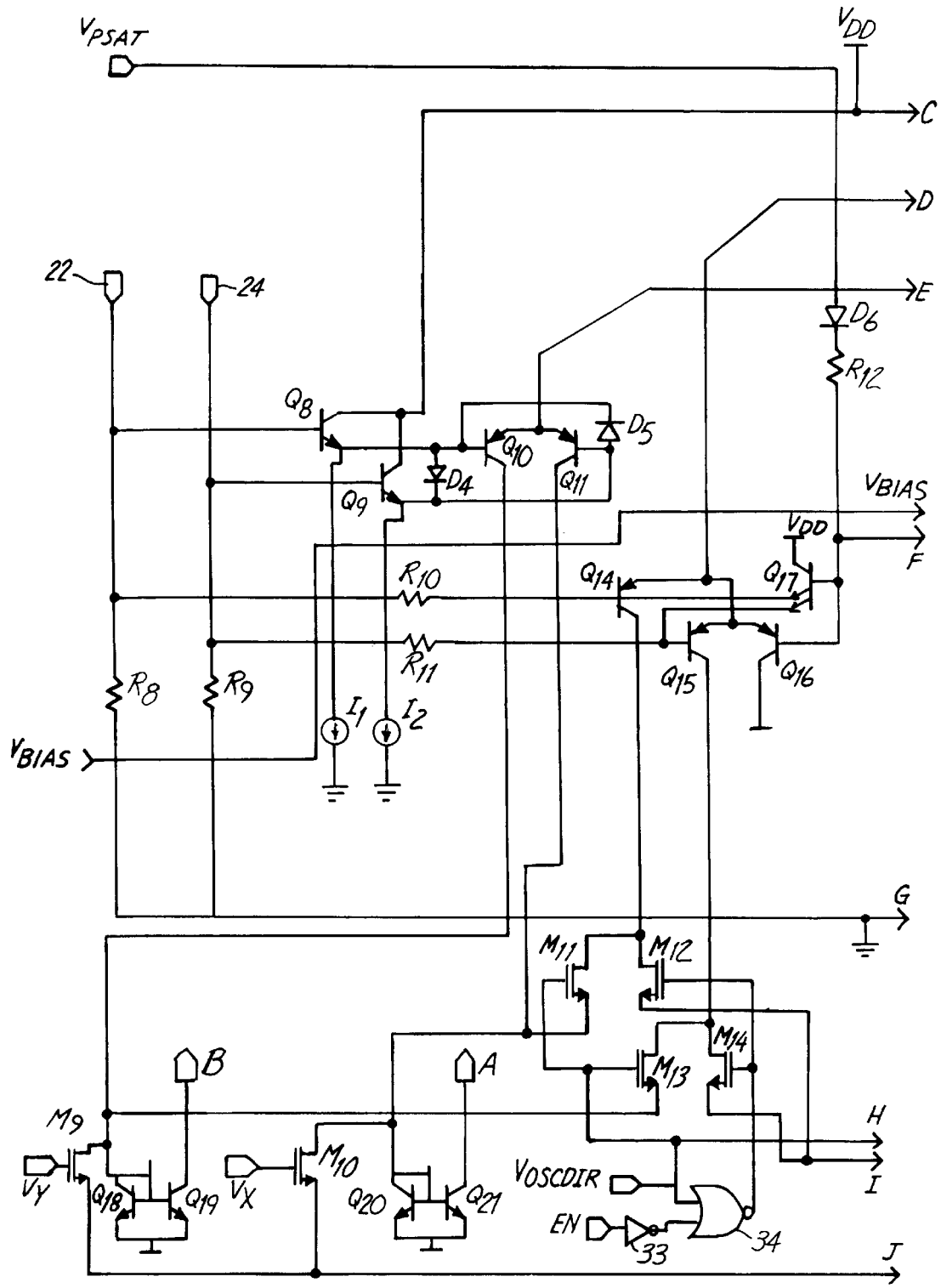
FIGS. 3A, 3B and 3C are circuit diagrams showing portions of the overshoot/undershoot control circuitry of an embodiment of the present invention.
Figure 3B:
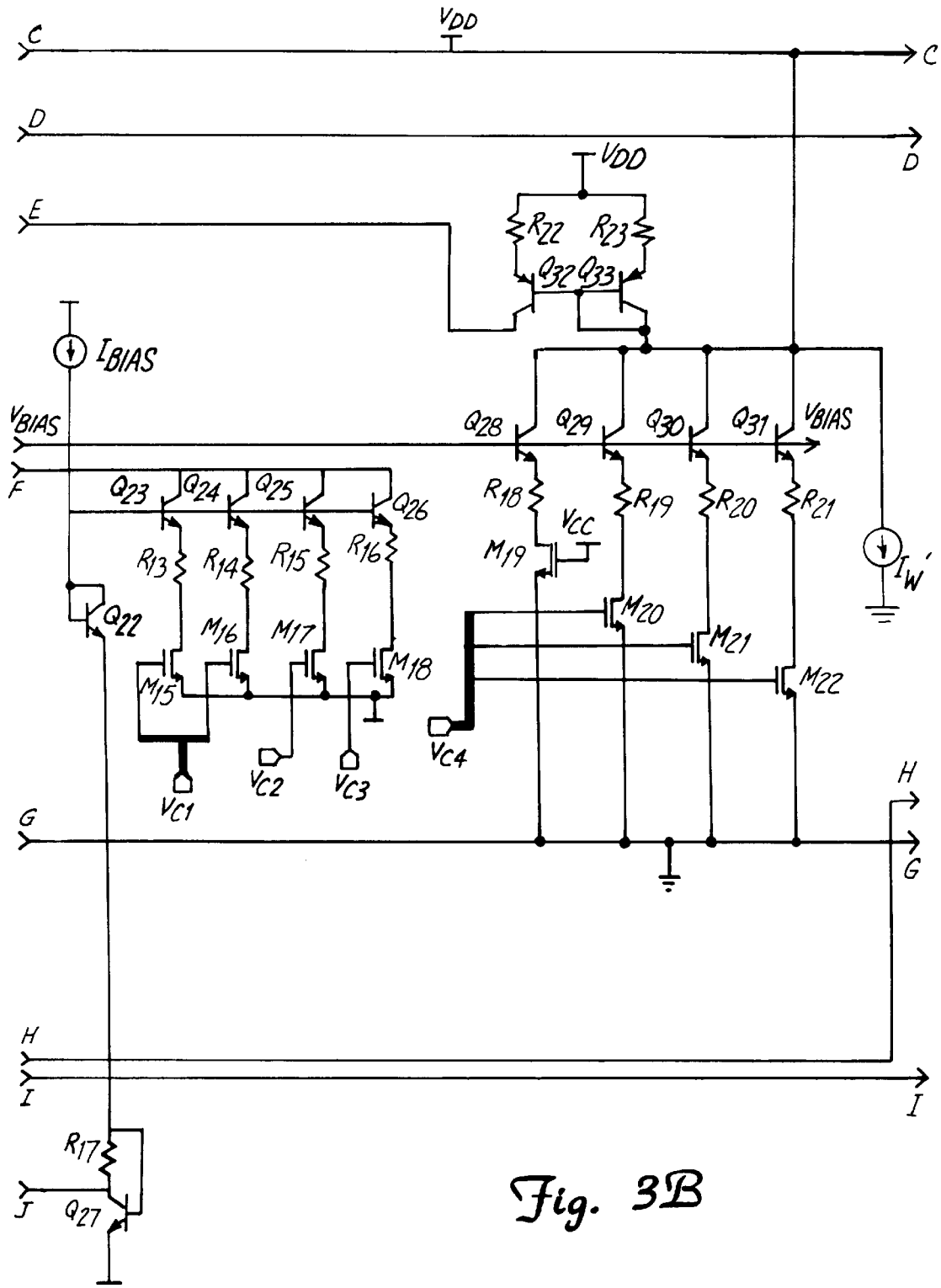
Figures 3C, 4:
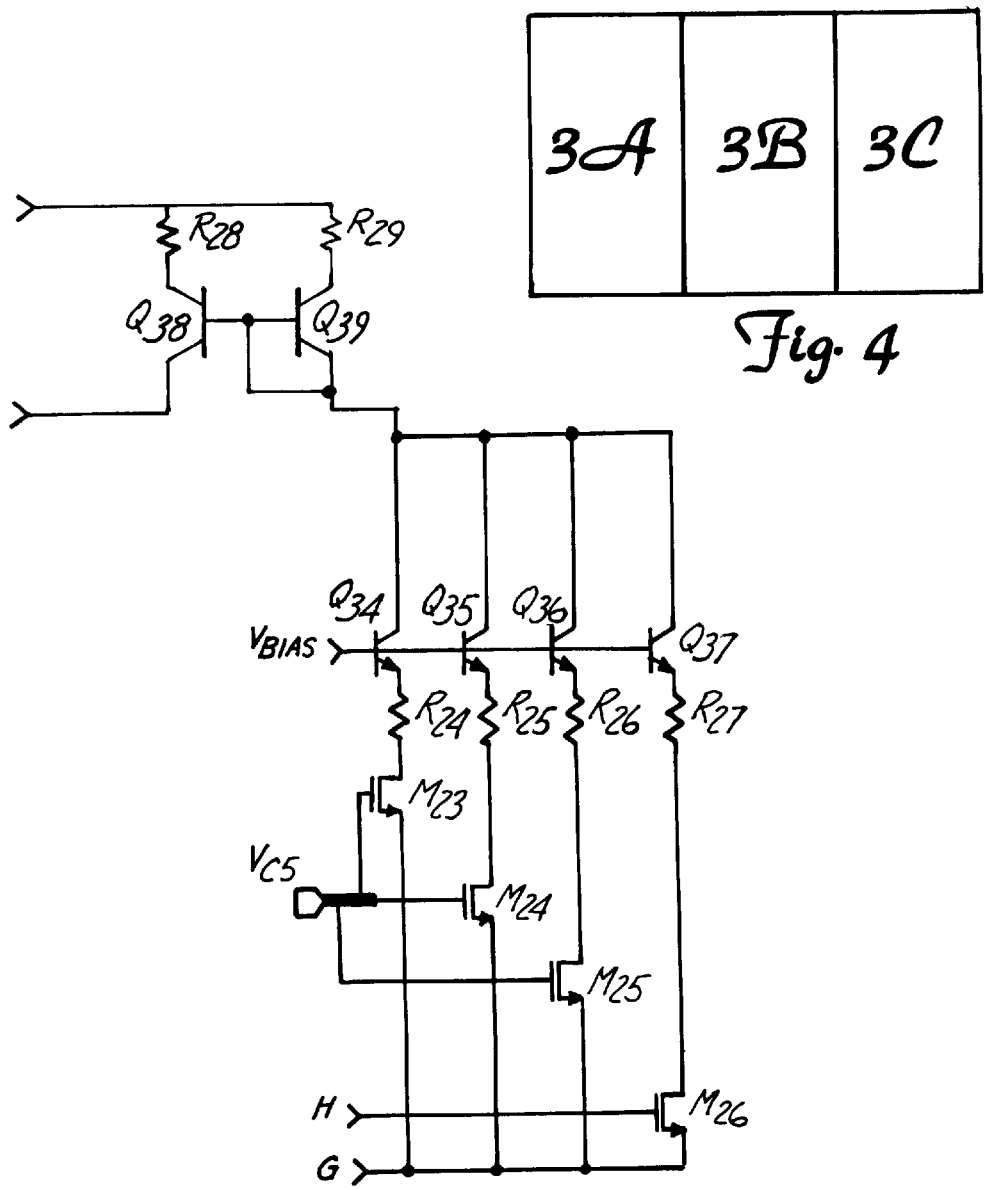
FIG. 4 is a diagram illustrating the relationship between FIGS. 3A, 3B and 3C.

FIGS. 3A, 3B and 3C together form a circuit diagram showing the overshoot/undershoot control circuitry of an embodiment of the present invention. The circuit diagram formed by FIGS. 3A, 3B and 3C is edge-matched as shown in FIG. 4, with connection nodes labeled C-J to clarify the connections made therein. Transistors $Q_8$, $Q_9$, $Q_{10}$ and $Q_{11}$ form a voltage monitor to provide a current output at the collector of one of transistors $Q_{10}$ and $Q_{11}$ based on which of terminals 22 and 24 has a higher voltage. Transistor $Q_8$ has its base connected to head terminal 22 and its emitter connected to current source $I_1$, and transistor $Q_9$ has its base connected to head terminal 24 and its emitter connected to current source $I_2$. PNP transistor $Q_{10}$ is provided with its base connected to the emitter of transistor $Q_8$, and PNP transistor $Q_{11}$ is provided with its base connected to the emitter of transistor $Q_9$ and with its emitter connected to the emitter of PNP transistor $Q_{10}$. Diode $D_4$ is connected between the base of PNP transistor $Q_{10}$ and the emitter of transistor $Q_9$, and diode $D_5$ is connected between the base of PNP transistor $Q_{11}$ and the emitter of transistor $Q_8$. Diodes $D_4$ and $D_5$ are provided to clamp the differential voltage at the bases of PNP transistors $Q_{10}$ and $Q_{11}$ to two diode drops and thereby ensure efficient operation of the circuit. Transistors $Q_8$ and $Q_9$ are connected as followers to couple the bases of PNP transistors $Q_{10}$ and $Q_{11}$ to respective head pins 22 and 24. Resistors $R_8$ and $R_9$ are tied to respective head pins 22 and 24 to pull the head pins down to ground when the head is biased off.

PNP transistors $Q_{10}$ and $Q_{11}$ are connected to conduct current based on the difference in voltage between head terminals 22 and 24. When the voltage at terminal 22 is greater than the voltage at terminal 24, PNP transistor $Q_{11}$ is operated to conduct a programmed current from its collector along a current path to a current mirror formed by transistors $Q_{20}$ and $Q_{21}$, which is operable to mirror the programmed current to terminal A. As shown in FIG. 2, terminal A is connected to the emitter of transistor $Q_3$. When the voltage at terminal 24 is greater than the voltage at terminal 22, PNP transistor $Q_{10}$ is operated to conduct a programmed current along a current path to a current mirror formed by transistors $Q_{18}$ and $Q_{19}$ which is operable to mirror the programmed current to terminal B. As shown in FIG. 2, terminal B is connected to the emitter of transistor $Q_4$. MOSFET $M_9$ is provided with its gate connected to input voltage signal $V_Y$, and provides a shunt current path to "steal" the conduction current from transistor $Q_{10}$ and to bias the current mirror formed by transistors $Q_{18}$ and $Q_{19}$ close to conduction for fast turn-on time during its next "on" cycle. Similarly, MOSFET $M_{10}$ is provided with its gate connected to input voltage signal $V_X$, and provides a shunt current path to "steal" the conduction current from transistor $Q_{11}$ and to bias the current mirror formed by transistors $Q_{20}$ and $Q_{21}$ close to conduction for fast turn-on time during its next "on" cycle.

In operation, when the input control voltages switch to indicate a transition in write current direction, the voltage at one of the head pins initially goes low due to inductive kick, then actually goes to a higher voltage level than the other head pin. As the head pin voltage settles to its final value, there is some ringing and undershoot that occurs—that is, instead of settling directly to the final head pin voltage, the head pin voltage waveform oscillates somewhat above and below the final value. This oscillation of head pin voltage causes a corresponding oscillation of write current above and below its quiescent value. The amount of write current oscillation below the final value is referred to as undershoot. By reducing undershoot, the write current will settle to its quiescent value more rapidly.

A current is injected during a transition period to adjust the write current during the time when one head pin rises to a higher voltage level than the other head pin. This current injection is effective to reduce write current undershoot, which reduces the overall settling time of the write current transition. The appropriate voltage level condition at the head terminals is detected by the circuitry shown in FIG. 3A. One condition of interest is defined by a period when the voltage at terminal 22 is greater than the voltage at terminal 24 and the input signal $V_X$ is low (that is, X (FIG. 1) is high)). When the voltage at terminal 22 is greater than the voltage at terminal 24, a current flows through PNP transistor $Q_{11}$ along the current path to the current mirror formed by transistors $Q_{20}$ and $Q_{21}$. However, to ensure that this current is mirrored into the H-switch circuit at the appropriate time, MOSFET $M_{10}$ is connected in a parallel current path, driven by input signal $V_X$. When $V_X$ is at a high voltage level, MOSFET $M_{10}$ is driven to conduct current so that the current mirror (transistors $Q_{20}$ and $Q_{21}$) does not inject current into the H-switch circuit. The other condition of interest is defined by a period when the voltage at terminal 24 is greater than the voltage at terminal 22 and the input signal $V_Y$ is low (that is, Y (FIG. 1) is high)). When the voltage at terminal 24 is greater than the voltage at terminal 22, a current flows through PNP transistor $Q_{10}$ along the current path to the current mirror formed by transistors $Q_{18}$ and $Q_{19}$. However, to ensure that this current is mirrored into the H-switch circuit at the appropriate time, MOSFET $M_9$ is connected in a parallel current path, driven by input signal $V_Y$. When $V_Y$ is at a high voltage level, MOSFET $M_9$ is driven to conduct current so that the current mirror (transistors $Q_{18}$ and $Q_{19}$) does not inject current into the H-switch circuit. Therefore, undershoot control is only effected when $V_{22} > V_{24}$ and $V_X$ is low, or when $V_{24} > V_{22}$ and $V_Y$ is low.

The amount of undershoot control current flowing from PNP transistors $Q_{10}$ and $Q_{11}$ is programmed and controlled by transistors $Q_{28}$, $Q_{29}$, $Q_{30}$ and $Q_{31}$, MOSFETS $M_{19}$, $M_{20}$, $M_{21}$ and $M_{22}$, and resistors $R_{18}$, $R_{19}$, $R_{20}$ and $R_{21}$ shown in FIG. 3B. A minimum undershoot control current is set by a current (indicated by $I_W'$) related to the write current, and by a current flowing through transistor $Q_{28}$, resistor $R_{18}$ and MOSFET $M_{19}$, which has a gate connected to $V_{CC}$ to keep it constantly conducting. In an exemplary embodiment, when the write current is 40 mA, the constant current $I_W'$ related to the write current is approximately 200 $\mu$A and the constant current flowing through transistor $Q_{28}$, resistor $R_{18}$ and MOSFET $M_{19}$ is approximately 200 $\mu$A. Additional undershoot control current is set by three bits provided at input terminal $V_{C4}$ coupled to the gates of MOSFETS $M_{20}$, $M_{21}$ and $M_{22}$. Setting the most significant bit, which is coupled to the gate of MOSFET $M_{20}$, causes current to flow through transistor $Q_{29}$, resistor $R_{19}$ and MOSFET $M_{20}$. Setting the next most significant bit, which is coupled to the gate of MOSFET $M_{21}$, causes current to flow through transistor $Q_{30}$, resistor $R_{20}$ and MOSFET $M_{21}$. Setting the least significant bit, which is coupled to the gate of MOSFET $M_{22}$, causes current to flow through transistor $Q_{31}$, resistor $R_{21}$ and MOSFET $M_{22}$. In an exemplary embodiment, the currents provided by each of the three transistors $Q_{29}$, $Q_{30}$ and $Q_{31}$ are 600 $\mu$A, 300 $\mu$A and 150 $\mu$A, respectively, so that the three input bits selectively provide an additional undershoot control current ranging from 150 $\mu$A to 1050 $\mu$A (in 150 $\mu$A increments).

A second comparator for monitoring the voltages of write head terminals 22 and 24 is provided by PNP transistors $Q_{14}$, $Q_{15}$ and $Q_{16}$. The base of PNP transistor $Q_{14}$ is connected through resistor $R_{10}$ to terminal 22, and the base of PNP transistor $Q_{15}$ is connected through resistor $R_{11}$ to terminal 24. In addition to resistors $R_{10}$ and $R_{11}$, dual-emitter transistor $Q_{17}$ is connected with its collector tied to $V_{DD}$ and its emitters tied to the bases of PNP transistors $Q_{14}$ and $Q_{15}$, to clamp the voltages at the bases of PNP transistors $Q_{14}$ and $Q_{15}$, and to provide a nominal delay from the head terminal voltages and the comparator due to the parasitics of resistors $R_{10}$ and $R_{11}$. The voltage at each of the head terminals 22 and 24 is compared to reference voltage at some level below the supply voltage, set by diode $D_6$, resistor $R_{12}$ and some switchable currents controlled by transistors $Q_{23}$, $Q_{24}$, $Q_{25}$ and $Q_{26}$, resistors $R_{13}$, $R_{14}$, $R_{15}$ and $R_{16}$, MOSFETS $M_{15}$, $M_{16}$, $M_{17}$ and $M_{18}$ and control inputs $V_{C1}$, $V_{C2}$ and $V_{C3}$ (FIG. 3B). These currents may be adjusted to control the threshold voltage for triggering the overshoot control of the present invention.

Currents flowing from PNP transistors $Q_{14}$ and $Q_{15}$ are coupled to a control network comprising MOSFETS $M_{11}$, $M_{12}$, $M_{13}$ and $M_{14}$. The control network is regulated by a $V_{OSCDIR}$ signal that indicates whether overshoot is to be increased or decreased. The $V_{OSCDIR}$ signal is connected to the gates of MOSFETS $M_{11}$ and $M_{13}$, and is coupled to an input of NOR gate 34. Enable signal EN is inverted by inverter 33 and coupled to the other input of NOR gate 34. The output of NOR gate 34 is connected to the gates of MOSFETS $M_{12}$ and $M_{14}$. Therefore, when the $V_{OSCDIR}$ signal is set high (indicating an increase in overshoot is desired), the currents flowing from PNP transistors $Q_{14}$ and $Q_{15}$ are routed through MOSFETS $M_{11}$ and $M_{13}$ to the current mirrors formed by transistors $Q_{18}$ and $Q_{19}$ and by transistors $Q_{20}$ and $Q_{21}$, to inject current into the H-switch in a similar manner as in the undershoot control as described above. However, to increase overshoot, the current is injected at an earlier time to boost the switching write current waveform to a higher level. The proper timing is ascertained based on the voltage comparator described above, enabling the injection of current once the head voltage drops below a threshold reference voltage.

When the $V_{OSCDIR}$ signal is set low (indicating a decrease in overshoot is desired), the currents flowing from PNP transistors $Q_{14}$ and $Q_{15}$ are routed through MOSFETs $M_{12}$ and $M_{14}$ and summed into the current mirror formed by transistors $Q_{40}$ and $Q_{41}$ (FIG. 3C). The gain of the current mirror is set by resistors $R_{30}$ and $R_{31}$. The output of the current mirror is connected through diode-connected transistor $Q_{42}$ and diode-connected PMOSFET $M_{27}$ to establish the voltage at the $V_{PGATE}$ node. The $V_{PGATE}$ node is connected to the gate of PMOSFET $M_4$ (FIG. 2) which is connected between write head terminals 22 and 24 to provide a shunting resistor to damp overshoot in the write current waveform. The shunting resistor is generically shown as $R_{shunt}$ in FIGS. 1 and 2.

The amount of the current flowing from PNP transistors $Q_{14}$ and $Q_{15}$ to effect overshoot control may be programmed and controlled by transistors $Q_{34}$, $Q_{35}$, $Q_{36}$ and $Q_{37}$, resistors $R_{24}$, $R_{25}$, $R_{26}$ and $R_{27}$, and MOSFETs $M_{23}$, $M_{24}$, $M_{25}$ and $M_{26}$. A minimum overshoot control current is set by transistor $Q_{37}$, resistor $R_{27}$ and MOSFET $M_{26}$, which is driven to conduction based on a high $V_{OSDIR}$ signal, indicating that an increase in overshoot is desired. Therefore, when overshoot is to be decreased, MOSFET $M_{26}$ is off, and the minimum overshoot control current is zero. In an exemplary embodiment, the minimum overshoot control current when overshoot is to be increased is approximately 250 µA. Additional overshoot control current is set by three bits provided at input terminal $V_{C5}$ coupled to the gates of MOSFETs $M_{23}$, $M_{24}$ and $M_{25}$. Setting the most significant bit, which is coupled to the gate of MOSFET $M_{23}$, causes current to flow through transistor $Q_{34}$, resistor $R_{24}$ and MOSFET $M_{23}$. Setting the next most significant bit, which is coupled to the gate of MOSFET $M_{24}$, causes current to flow through transistor $Q_{35}$, resistor $R_{25}$ and MOSFET $M_{24}$. Setting the least significant bit, which is coupled to the gate of MOSFET $M_{25}$, causes current to flow through transistor $Q_{36}$, resistor $R_{26}$ and MOSFET $M_{25}$. In an exemplary embodiment, the currents provided by each of the transistors $Q_{34}$, $Q_{35}$ and $Q_{36}$ are 1000 µA, 500 µA and 250 µA, respectively, so that the three input bits selectively provide an additional overshoot control current ranging from 250 µA to 1750 µA (in 250 µA increments).

The present invention improves the efficiency of operation of a write driver circuit by reducing the turn-on and turn-off times of the write driver's switching transistors. Special provisions are made by the invention to perform steps to quickly turn the switching transistors on and off only during the critical time period associated with a transition in write current direction. Current is pulled from the base of the upper-H-switch transistors by the turn-off control circuitry only when the input signals indicate a change in write current direction is to take place. Capacitors are connected in the turn-off control circuitry to cause the turn-off control circuitry to pull extra current immediately following a change in the input signals, turning the switching transistor off even more quickly. The turn-on control circuitry is also connected with a pull-up resistor and active devices connected to a control element of the switching transistors. The active devices are coupled to the opposite side switching transistors to drive the active devices to maximum conduction, thereby pulling up a voltage at the control element of the switching transistors and turning them on quickly, during the transition period. The voltage waveform characteristics of the opposite side switching transistors are ideal to drive the active devices hard only during a write current transition, which preserves the active devices and ensures greater reliability of those devices.

Although the present invention has been described with reference to preferred embodiments, workers skilled in the art will recognize that changes may be made in form and detail without departing from the spirit and scope of the invention.

What is claimed is:

1. In a write current driver circuit including first and second switching devices for directing write current in opposite directions through a write head between first and second terminals in response to first and second input signals, the improvement of turn-off control circuitry comprising:

a first active device coupled to a control element of the first switching device;

a second active device coupled to a control element of the second switching device;

first control means for operating the first active device to pull current from the control element of the first switching device in a first current path upon activation of the second input signal;

second control means for operating the second active device to pull current from the control element of the second switching device in a second current path upon activation of the first input signal;

a first capacitor coupled between the first input signal and a controlled element of the first active device; and a second capacitor coupled between the second input signal and a controlled element of the second active device.

2. The apparatus of claim 1, further comprising:
a first resistor in the first current path; and
a second resistor in the second current path.

3. The apparatus of claim 1, further comprising:
means for positively clamping the first and second capacitors.

4. The apparatus of claim 3, wherein the means for positively clamping the first and second capacitors comprises:
first and second diodes coupled in series between the controlled element of the second active device and the second control means; and
a third diode coupled between the controlled element of the first active device and a node between the first and second diodes.

5. The apparatus of claim 1, further comprising turn-on control circuitry comprising:
a first resistor coupled between a control element of the first switching device and a fixed voltage;
a second resistor coupled between a control element of the second switching device and the fixed voltage;
at least one third active device coupled between the control element of the first switching device and the fixed voltage, the at least one third active device having a control element coupled to the control element of the second switching device; and
at least one fourth active device coupled between the control element of the second switching device and the fixed voltage, the at least one fourth active device having a control element coupled to the control element of the first switching device.

6. In a write current driver circuit including first and second switching devices for directing write current in opposite directions through a write head between first and second terminals in response to first and second input signals, the improvement of turn-off control circuitry comprising:
a first active device coupled to a control element of the first switching device;
a second active device coupled to a control element of the second switching device;
a first MOSFET having a gate coupled to the second input signal and being coupled to pull current from the control element of the first switching device in a first current path upon activation of the second input signal; and
a second MOSFET having a gate coupled to the first input signal and being coupled to pull current from the control element of the second switching device in a second current path upon activation of the first input signal.

7. The apparatus of claim 6, further comprising:
a first capacitor coupled between the gate of the second MOSFET and a controlled element of the first active device; and
a second capacitor coupled between the gate of the first MOSFET and a controlled element of the second active device.

8. The apparatus of claim 7, further comprising:
means for positively clamping the first and second capacitors.

9. The apparatus of claim 8, wherein the means for positively clamping the first and second capacitors comprises:
first and second diodes coupled in series between the controlled element of the second active device and a controlled element of the second MOSFET; and
a third diode coupled between the controlled element of the first active device and a node between the first and second diodes.

10. In a write current driver circuit including first and second switching devices for directing write current in opposite directions through a write head between first and second terminals, the improvement of turn-on control circuitry comprising:
a first resistor coupled between a control element of the first switching device and a fixed voltage;
a second resistor coupled between a control element of the second switching device and the fixed voltage;
at least one first active device coupled between the control element of the first switching device and the fixed voltage, the at least one first active device having a control element directly connected to the control element of the second switching device; and
at least one second active device coupled between the control element of the second switching device and the fixed voltage, the at least one second active device having a control element directly connected to the control element of the first switching device.

11. In a write current driver circuit including a high fixed voltage level, a low fixed voltage level, and first and second switching devices for directing write current in opposite directions through a write head between first and second terminals, the improvement of turn-on control circuitry comprising:
a first resistor coupled between a control element of the first switching device and the high fixed voltage;
a second resistor coupled between a control element of the second switching device and the high fixed voltage;
at least one first active device coupled between the control element of the first switching device and the high fixed voltage, the at least one first active device having a control element coupled to the control element of the second switching device; and
at least one second active device coupled between the control element of the second switching device and the high fixed voltage, the at least one second active device having a control element coupled to the control element of the first switching device.

12. In a write current driver circuit including first and second transistors for directing write current in opposite directions through a write head between first and second terminals in response to first and second input signals, the improvement of turn-off control circuitry comprising:
a third transistor coupled to a base of the first transistor;
a fourth transistor coupled to a base of the second transistor;
a first MOSFET having a gate coupled to the second input signal and being coupled to the third transistor to pull current from the base of the first transistor through the third transistor upon activation of the second input signal; and
a second MOSFET having a gate coupled to the first input signal and being coupled to the fourth transistor to pull current from the base of the second transistor through the fourth transistor upon activation of the first input signal.

13. The apparatus of claim 12, further comprising:
a first capacitor coupled between the first input signal and the third transistor; and
a second capacitor coupled between the second input signal and the fourth transistor.

14. The apparatus of claim 13, further comprising:
a first resistor coupled between the third transistor and the first MOSFET; and
a second resistor coupled between the fourth transistor and the second MOSFET.

* * * * *

UNITED STATES PATENT AND TRADEMARK OFFICE
CERTIFICATE OF CORRECTION

PATENT NO. : 6,184,727 B1  Page 1 of 1
DATED : February 6, 2001
INVENTOR(S) : John J. Price Jr.

It is certified that error appears in the above-identified patent and that said Letters Patent is hereby corrected as shown below:

<u>Column 1,</u>
Line 12, delete "09/252,502", insert -- 09/292,502 --
Line 14, delete "09/282,557", insert -- 09/292,557 --

Signed and Sealed this

Twenty-sixth Day of February, 2002

Attest:

JAMES E. ROGAN
*Attesting Officer*   *Director of the United States Patent and Trademark Office*